United States Patent
Bartl et al.

(10) Patent No.: US 9,343,646 B2
(45) Date of Patent: May 17, 2016

(54) THERMO-ELECTRIC POWER HARVESTING BEARING CONFIGURATION

(71) Applicants: Frank Bartl, Grenzach-Wyhlen (DE); Andreas Clemens Van Der Ham, Utrecht (NL)

(72) Inventors: Frank Bartl, Grenzach-Wyhlen (DE); Andreas Clemens Van Der Ham, Utrecht (NL)

(73) Assignee: AKTIEBOLAGET SKF, Gothenburg (SE)

( * ) Notice: Subject to any disclaimer, the term of this patent is extended or adjusted under 35 U.S.C. 154(b) by 0 days.

(21) Appl. No.: 14/350,298

(22) PCT Filed: Oct. 3, 2012

(86) PCT No.: PCT/EP2012/069540
§ 371 (c)(1),
(2) Date: Apr. 7, 2014

(87) PCT Pub. No.: WO2013/050418
PCT Pub. Date: Apr. 11, 2013

(65) Prior Publication Data
US 2015/0083179 A1    Mar. 26, 2015

Related U.S. Application Data

(60) Provisional application No. 61/544,100, filed on Oct. 6, 2011.

(51) Int. Cl.
| | |
|---|---|
| *H01L 35/30* | (2006.01) |
| *F16C 37/00* | (2006.01) |
| *F16C 41/00* | (2006.01) |
| *H01L 35/28* | (2006.01) |
| *F16C 35/04* | (2006.01) |
| *H02J 5/00* | (2016.01) |

(52) U.S. Cl.
CPC .............. *H01L 35/30* (2013.01); *F16C 35/042* (2013.01); *F16C 37/007* (2013.01); *F16C 41/004* (2013.01); *H01L 35/28* (2013.01); *H02J 5/005* (2013.01)

(58) Field of Classification Search
CPC ...... F16C 35/00; F16C 35/004; F16C 35/042; F16C 35/16; F16C 35/007; F16C 41/00; F16C 41/005; F16C 41/004; F16C 41/002; H01L 35/30; H01L 35/28; H01L 35/32; H01L 35/325; H01L 31/052; H01L 31/0521; H01L 35/34; H02S 10/10; H02S 10/30; H02S 40/40
USPC .......... 136/200, 203, 205, 218, 230, 211, 212
See application file for complete search history.

(56) References Cited

U.S. PATENT DOCUMENTS

| | | | | |
|---|---|---|---|---|
| 4,520,305 | A | * | 5/1985 | Cauchy .................... 322/2 R |
| 5,915,843 | A | * | 6/1999 | Mattera ..................... 384/316 |
| 2002/0054719 | A1 | * | 5/2002 | Takizawa et al. .......... 384/448 |

FOREIGN PATENT DOCUMENTS

| | | |
|---|---|---|
| DE | 102007029571 A1 | 11/2008 |
| EP | 1729195 A1 | 12/2006 |

(Continued)

*Primary Examiner* — Jeffrey T Barton
*Assistant Examiner* — Daniel Malley, Jr.
(74) *Attorney, Agent, or Firm* — Bryan Peckjian; SKF USA Inc. Patent Dept.

(57) ABSTRACT

A power generating bearing assembly (100) comprises a bearing subassembly (120) retained by a bearing housing (110). During operation, friction and other factors increase a temperature of the bearing assembly (100). The housing (110) can optionally include a bearing cooling passage system comprising at least one liquid cooling passage (134) formed internally therein. The liquid cooling passage (134) would be routed proximate the bearing subassembly (120) to remove heat therefrom. A thermal energy transfer media (204) is inserted into a thermal transfer conduit (180), wherein the thermal transfer conduit (180) passes across a heated section of the housing (110). The transfer media (204) conveys the thermal energy to a Thermo-Electric Generator (TEG) (200) located in a thermoelectric generator housing (250) attached to the bearing housing (110). The Thermo-Electric Generator (TEG) (200) utilizes a temperature difference between the transfer media (204) and the ambient air to generated electric power. The power can be used to operate electrically powered devices, such as condition sensors (150), communication devices, and the like.

12 Claims, 7 Drawing Sheets

(56) References Cited

FOREIGN PATENT DOCUMENTS

| JP | 2008223843 A | 9/2008 |
|----|--------------|--------|
| WO | 20110065882 A1 | 6/2011 |
| WO | 2011082836 A1 | 7/2011 |

* cited by examiner

THERMO-ELECTRIC POWER HARVESTING BEARING CONFIGURATION

CROSS REFERENCE TO RELATED APPLICATION

This is a United States National Stage Application claiming the benefit of International Application No. PCT/EP2012/069540 filed on 3 Oct. 2012, which claims priority to U.S. Provisional Patent Application No. 61/544,100 filed on 6 Oct. 2011, both of which are incorporated herein by reference in their entireties.

TECHNICAL FIELD OF THE INVENTION

The present invention relates to an apparatus and method for generating power utilizing a Thermo-Electric Generator (TEG) to convert thermal energy generated by rotation of a bearing within a bearing housing into electric energy.

BACKGROUND ART

Bearings are used to support many rotating objects. Bearings are commonly integrated into a variety of machines. The bearings are a key factor contributing to the reliability of the machine. The system designed commonly installs one or more bearing condition monitoring devices to ensure the bearings remain in working order. The majority of the condition monitoring devices requires low voltage electrical power for operation. Some systems include other components that also utilize electrical power. One such electrically operated component can be a communication device for transferring the condition monitoring information to a remote service company.

Bearings can be integrated into many different machines having a wide variety of applications. The applications can be deployed at very remote, rural locations, commonly void of utility provided power.

Batteries provide a limited capacity, which dictates a limited supply and thus a limited run time. Obtaining power from a commercial utility source can be costly, particularly for remote installations. Transferring electrical power from a commercially available source can require running extensive and costly power cabling and support equipment. Maintenance of these systems must be considered. Replacement of batteries incurs both parts and labor costs. These concerns are aggravated for temporary installations.

During operation, the bearing can generate a significant amount of heat. Bearing which generate a significant amount of heat commonly include heat dissipation or thermal transfer systems. One exemplary thermal transfer system includes one or more integrated liquid cooling passages. Liquid coolant is pumped through the integrated liquid cooling passages extracting heat from the bearing or bearing assembly. The liquid coolant is passed through a heat exchanger to remove the extracted heat from the liquid coolant. The cooled coolant is returned to the bearing housing to repeat the heat extraction or thermal regulation process.

Thermo-Electric Generators (TEG's) are commonly available in a variety of form factors. They are available is a variety of different sizes and performance levels. Thermo-Electric Generators (TEG's) are offered utilizing either of two technologies: (a) normal thermo couples and (b) thin film technology.

Thermo coupled based Thermo-Electric Generators (TEG's) utilize a thermocouple consists of two conductors of different materials (usually metal alloys). Any junction of dissimilar metals will produce an electric potential related to temperature. The thermocouple produces a voltage in the vicinity of the point where the two conductors contact one another. The voltage produced is dependent on, but not necessarily proportional to, the difference of temperature of the junction to other parts of the respective conductors. Thermocouples are used in a variety of applications, including a temperature sensor, a device for converting a temperature gradient into electricity, and the like. Commercial thermocouples are inexpensive, interchangeable, are supplied with standard connectors, and can measure a wide range of temperatures. One advantage of a thermocouple over other methods of measuring a temperature is that thermocouples are self-powered.

A thermocouple can produce an electric current. The concept utilizes what is referred to as the Peltier effect. The Peltier effect is the presence of heat at an electrified junction of two different metals. When a current is made to flow through a junction composed of materials A and B, heat is generated at the upper junction at $T2$, and absorbed at the lower junction at $T1$. The Thermo-Electric Generator (TEG) applies the thermocouple in accordance with the reverse concept of the Peltier effect, whereby the presence of heat at the upper junction $T2$, and the presence of a reduced temperature at the lower junction at $T1$ the thermocouple generates a current.

The Thermo-Electric Generator (TEG) can utilize a series of thermocouples connected in series to form a thermopile, where all the hot junctions are exposed to a higher temperature and all the cold junctions to a lower temperature. The output is the sum of the voltages across the individual junctions, giving larger voltage and power output.

Thin film technology based Thermo-Electric Generators (TEG's) are fabricated utilizing Peltier cooler chips, or a generator based upon the Seebeck effect. The Thermo-Electric Generator (TEG) consists of leg pairs of n- and p-type material. Each leg pair generates a certain voltage. The voltage (U) generated by a Thermo-Electric Generator (TEG) is directly proportional to the number of leg pairs (N) and the temperature difference ($\Delta T$) between top and bottom side times the Seebeck coefficient ($\alpha$), where:

$$U = N(\text{times})\Delta T(\text{times})\alpha.$$

The Seebeck effect is caused by two things: charge-carrier diffusion and phonon drag. Charge carriers in the materials will diffuse when one end of a conductor is at a different temperature from the other. Hot carriers diffuse from the hot end to the cold end, since there is a lower density of hot carriers at the cold end of the conductor, and vice versa. If the conductor were left to reach thermodynamic equilibrium, this process would result in heat being distributed evenly throughout the conductor. The movement of heat (in the form of hot charge carriers) from one end to the other is a heat current and an electric current as charge carriers are moving.

Recently developed thermoelectric devices are made from alternating p-type and n-type semiconductor elements connected by metallic connectors. Semiconductor junctions are common in power generation devices, while metallic junctions are more common in temperature measurement. Charge flows through the n-type element, crosses a metallic interconnect, and passes into the p-type element.

The thermoelectric device can be utilized in either of two applications: (a) utilizing power to control temperature and (b) utilize a thermal difference to generate electric power. In the first configuration, where power is provide the thermoelectric device provides a thermal generating device, utilizing the Peltier effect to act as a cooler. In this configuration, electrons in the n-type element move opposite the direction of current and holes in the p-type element will move in the direction of current, both removing heat from one side of the device. In the second configuration, where a thermal difference is applied to the thermoelectric device, the thermoelectric device functions as a power generator. The heat source drives electrons in the n-type element toward the cooler region, creating a current through the circuit. Holes in the p-type element then flow in the direction of the current. Therefore, thermal energy is converted into electrical energy.

Thermo-Electric Generators (TEG's) can also utilize other effects, including:
  (A) The Ettingshausen Effect, which is a thermoelectric (or thermo magnetic) phenomenon that affects the electric current in a conductor when a magnetic field is present, and/or
  (B) The Nernst effect, which is a thermoelectric (or thermo magnetic) phenomenon observed when a sample allowing electrical conduction is subjected to a magnetic field and a temperature gradient normal (perpendicular) to each other.

A variety of parameters are monitored to continuously determine a condition of a bearing. The application of the bearing may limit the availability or ease of providing electrical power to the sensors used to monitor the condition of the bearing. What is desired is a power generating system that can be integrated into the bearing assembly to harvest power from the bearing assembly and utilize the harvested power to generate electrical energy.

DISCLOSURE OF THE INVENTION

The present invention is directed towards an apparatus and respective method for generating electrical energy utilizing thermal energy generated during operation of a bearing or bearing assembly.

In a first aspect of the present invention, a power generating bearing assembly, the power generating bearing assembly comprising:
  a bearing housing comprising:
  a bearing subassembly receptacle, and
  a thermal transfer conduit;
  a bearing subassembly retained within the bearing subassembly receptacle; and
  a Thermo-Electric Generator (TEG) assembly comprising:
  a thermo-generator housing,
  a thermal energy transfer media extending through the thermal transfer conduit and into the thermo-generator housing,
  a Thermo-Electric Generator (TEG) located within the thermo-generator housing, wherein the Thermo-Electric Generator (TEG) contains a thermal difference by thermal communication between a first surface of the Thermo-Electric Generator (TEG) and a surface of the thermal energy transfer media and a second surface of the Thermo-Electric Generator (TEG) and ambient air,
  wherein during operation, heat generated by rotation of the bearing subassembly elevates a temperature of the bearing housing, the Thermo-Electric Generator (TEG) converts the thermal difference between the elevated temperature of the thermal energy transfer media and the ambient temperature to electric power.

In a second aspect, the bearing housing further comprises at least one integrated liquid cooling passage, wherein the at least one integrated liquid cooling passage is routed proximate the bearing subassembly.

In another aspect, the at least one integrated liquid cooling passage is further defined having a low temperature coolant fluid section and an elevated temperature coolant fluid section.

In another aspect, the thermal transfer conduit is routed passing a location proximate the elevated temperature coolant fluid segment of one of the at least one integrated liquid cooling passages.

In another aspect, the Thermo-Electric Generator (TEG) is thermally coupled to the thermal energy transfer media using a thermally conductive material inserted therebetween. The thermally conductive material preferably circumscribes a portion of the thermal energy transfer media.

In another aspect, the second surface of the Thermo-Electric Generator (TEG) is in thermal communication with a wall segment of the thermoelectric generator housing.

In another aspect, a biasing member retains the Thermo-Electric Generator (TEG) in thermal communication with the wall segment of the thermoelectric generator housing.

In another aspect, the biasing member retains the Thermo-Electric Generator (TEG) in thermal communication with the thermally conductive material circumscribing a portion of the thermal energy transfer media.

In another aspect, a preexisting cable routing conduit provides the thermal transfer conduit.

In another aspect, the thermoelectric generator housing is attached to an external surface of the bearing housing.

In another aspect, cooling fins are thermally coupled to an exposed surface of the thermoelectric generator cover plate, wherein the cooling fins increase thermal cooling of the exposed surface of the thermoelectric generator cover plate, transferring the cooler temperatures to the Thermo-Electric Generator (TEG) via the thermo-generator cavity filler.

In another aspect, the thermal transfer conduit is routed passing a location proximate a cooling system discharge port.

In another aspect, the thermal transfer conduit is routed passing a location proximate a location of the discharge or return end of the integrated bearing cooling passage system.

In another aspect, the Thermo-Electric Generator (TEG) utilizes normal thermo couple technology.

In another aspect, the Thermo-Electric Generator (TEG) utilizes thin film technology.

In another aspect, the Thermo-Electric Generator (TEG) further comprises passive wireless transmission technology.

In another aspect, the Thermo-Electric Generator (TEG) is utilized to provide power to a separate electrically powered device.

In another aspect, the Thermo-Electric Generator (TEG) is utilized to power at least one bearing condition monitoring sensor.

In another aspect, the Thermo-Electric Generator (TEG) is utilized to power at least one bearing condition monitoring sensor associated with the same bearing assembly.

In another aspect, the Thermo-Electric Generator (TEG) is utilized to power at least one bearing condition monitoring sensor associated with the same bearing assembly and at least one bearing condition monitoring sensor associated with a separate bearing assembly located proximate the power generating bearing assembly.

One advantage of the present invention is the ability to easily incorporate a Thermo-Electric Generator (TEG) onto a bearing assembly to create a power harvesting bearing assembly. The conversion from a standard bearing assembly to a power harvesting bearing assembly can be accomplished by forming a thermal transfer conduit extending inwards from an exterior surface of the bearing housing, wherein the thermal transfer conduit is routed passing a target area having an elevated temperature during operation. A thermal energy transfer media is located spanning from within an interior of a thermoelectric generator housing through at least a portion of a length of the thermal transfer conduit. The thermal energy transfer media absorbs heat generated during operation of the bearing and transfers the thermal energy to the interior of the thermoelectric generator housing. The Thermo-Electric Generator (TEG) integrated within thermoelectric generator housing converts the transferred thermal energy into electric power. This configuration can utilize an existing cable conduit or a machined passage. The configuration transfers the elevated heat to a location where the opposite surface is exposed to ambient air. This optimizes the thermal difference to increase the efficiency of the generation of the electric power.

Another advantage of the present invention is the ability to generate a continuous electrical current using thermal energy obtained from a liquid cooling system integrated into the cooling system. The inclusion of the liquid cooling system enhances a process of removing heat from the bearing assembly. The liquid cooling system can be used to increase the efficiency of the Thermo-Electric Generator (TEG) by collecting, directing and focusing the heat to a specific region of the bearing housing. The thermal energy transfer media would be routed proximate to or passing a return or high temperature region the liquid cooling system. This configuration optimizes the thermal transfer of the heat generated by the bearing during operation to the Thermo-Electric Generator (TEG). Additionally, this configuration avoids penetration of the integrated liquid cooling passage, thus ensuring against any potential fluid leaks. The Thermo-Electric Generator (TEG) can be readily accessed for service and maintenance, as the Thermo-Electric Generator (TEG) is located on an exterior of the bearing housing and within a thermoelectric generator housing.

One or more sensors can be employed to monitor a condition of a bearing. The sensors are commonly operated using electrical power. The sensors can monitor a variety of parameters to continuously determine a condition of a bearing. Communication devices could be employed as a vehicle to transfer information to a remote monitoring facility. These communication devices are also operated using electrical power. It is not uncommon where a system utilizing a bearing assembly would be located in a remote area where sourcing electrical power could be difficult. Bearing assemblies can be utilized on equipment deployed in remote locations. The application of the bearing assembly may limit the availability or ease of providing electrical power to the sensors used to monitor the condition of the bearing. The inclusion of an electrical power-generating device within a bearing assembly eliminates the need for an external source of electrical power. Additionally, by utilizing thermal energy obtained from a location within the bearing housing, the electrical energy is not drawing energy from the rotation of a bearing inner ring of the bearing subassembly or other rotating elements of the system. Therefore, the Thermo-Electric Generator (TEG) is not impacting the efficiency of the rotating elements of the system.

Another advantage of the present invention is the flexibility for the installation. The installation can be accomplished by thermally coupling the Thermo-Electric Generator (TEG) to any suitable location on the bearing housing. The efficiency can be optimized by determining the location and routing of the thermal transfer conduit to obtain the highest temperature from the bearing during operation. The temperature differential can be increased by transferring the heat generated during operation the bearing to a remotely located Thermo-Electric Generator (TEG) using an efficient thermal energy transfer media. The Thermo-Electric Generator (TEG) can be placed externally of the bearing housing, exposing the cold carrier of the Thermo-Electric Generator (TEG) to the ambient air. This configuration optimizes the thermal delta across the Thermo-Electric Generator (TEG).

The location of condition monitoring sensors could complicate any provisions for externally provided power for monitoring the condition of the bearing. The bearing(s) can be integrated into the equipment at a location that is difficult to access, particularly for wiring. The integration of a power generator with the bearing assembly optimizes a source for electrical power at a location proximate the sensors or other equipment requiring the electrical power. The thermal transfer conduit can be routed between a thermally optimized location within the bearing housing and an external location optimized for one or more electrically operated components anticipating power from the Thermo-Electric Generator (TEG). This provides two advantages: optimizing a thermal source, while significantly reducing a length of wiring required. The reduced wiring avoids any accidentally interference or abrasion by any rotational movements or other movements of components of the equipment.

These and other features, aspects, and advantages of the invention will be further understood and appreciated by those skilled in the art by reference to the following written specification, claims and appended drawings, which follow.

BRIEF DESCRIPTION OF THE DRAWINGS

For a fuller understanding of the nature of the present invention, reference should be made to the accompanying drawings in which.

Like reference numerals refer to like parts throughout the several views of the drawings.

MODES FOR CARRYING OUT THE INVENTION

The following detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to make or use the embodiments of the disclosure and are not intended to limit the scope of the disclosure, which is defined by the claims. For purposes of description herein, the terms "upper", "lower", "left", "rear", "right", "front", "vertical", "horizontal", and derivatives thereof shall relate to the invention as oriented in FIG. 1. Furthermore, there is no intention to be bound by any expressed or implied theory presented in the preceding technical field, background, brief summary or the following detailed description. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

Figure 1:
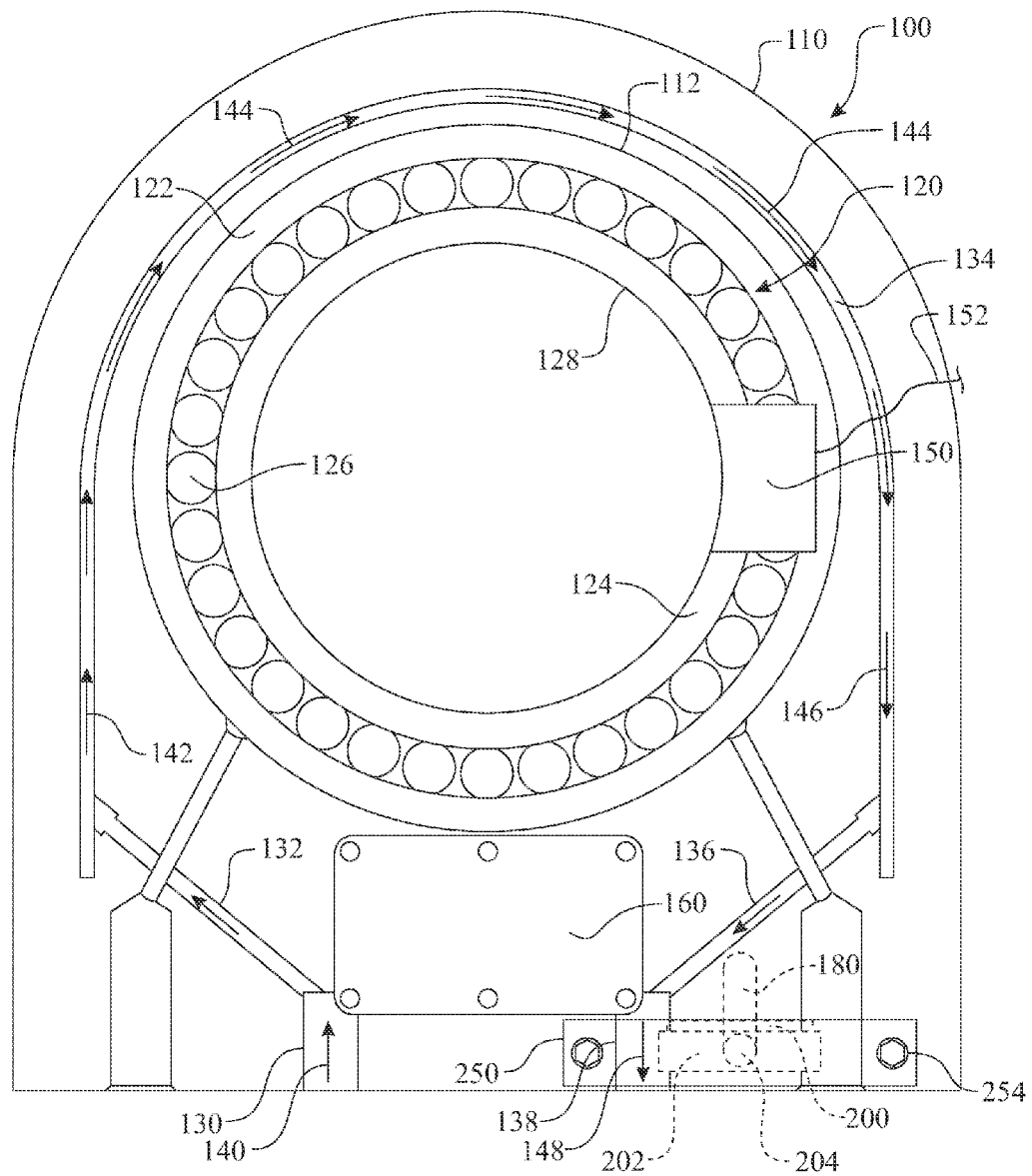
FIG. 1 presents an internal elevation view of an exemplary bearing assembly comprising a thermal energy transfer media within a thermal transfer conduit which transfers heat generated during operation of bearing to a Thermo-Electric Generator (TEG) attached to an exterior of a bearing housing.
Figure 2:
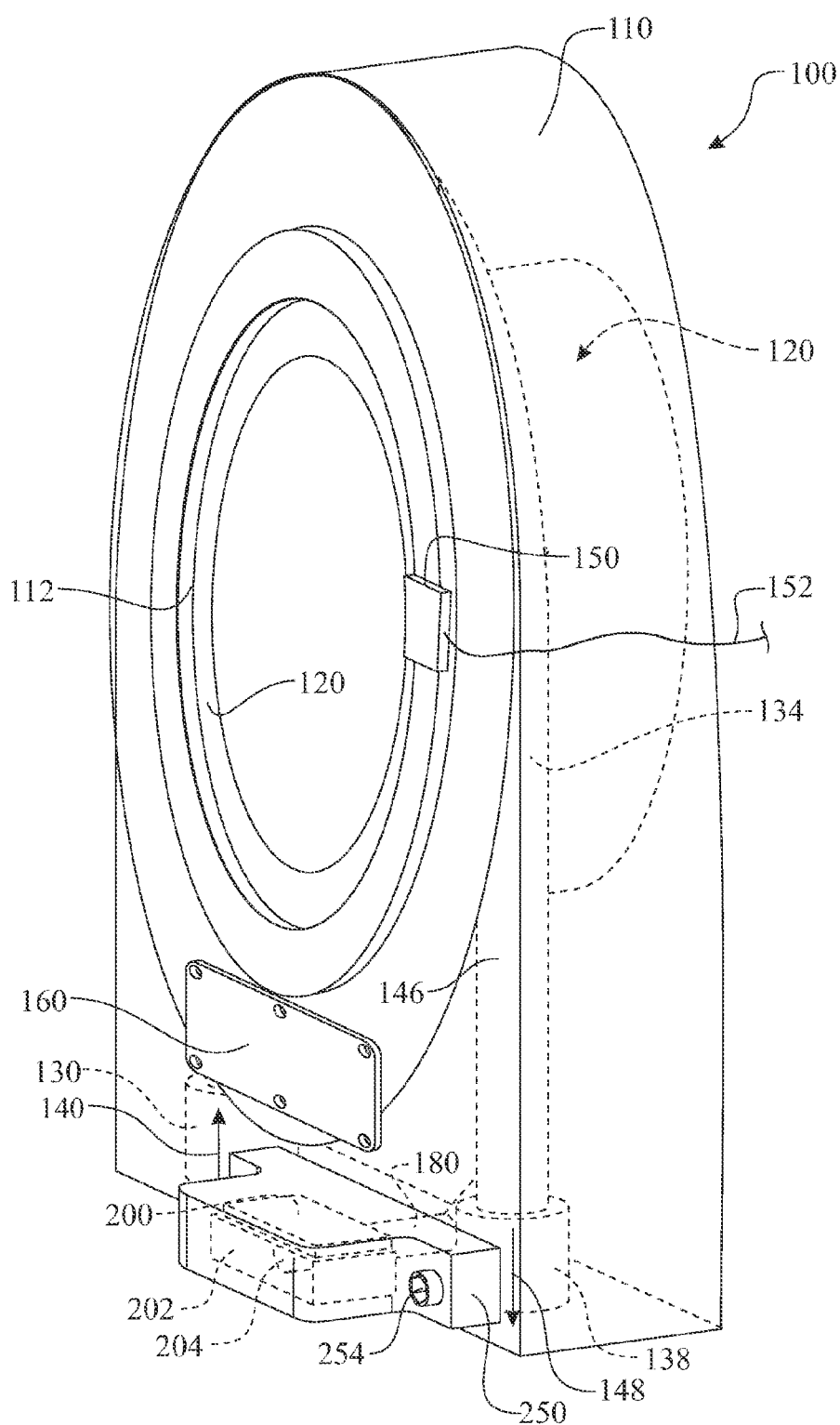
FIG. 2 presents an isometric view of the exemplary bearing assembly comprising the Thermo-Electric Generator (TEG), originally introduced in FIG. 1.
Figure 3:
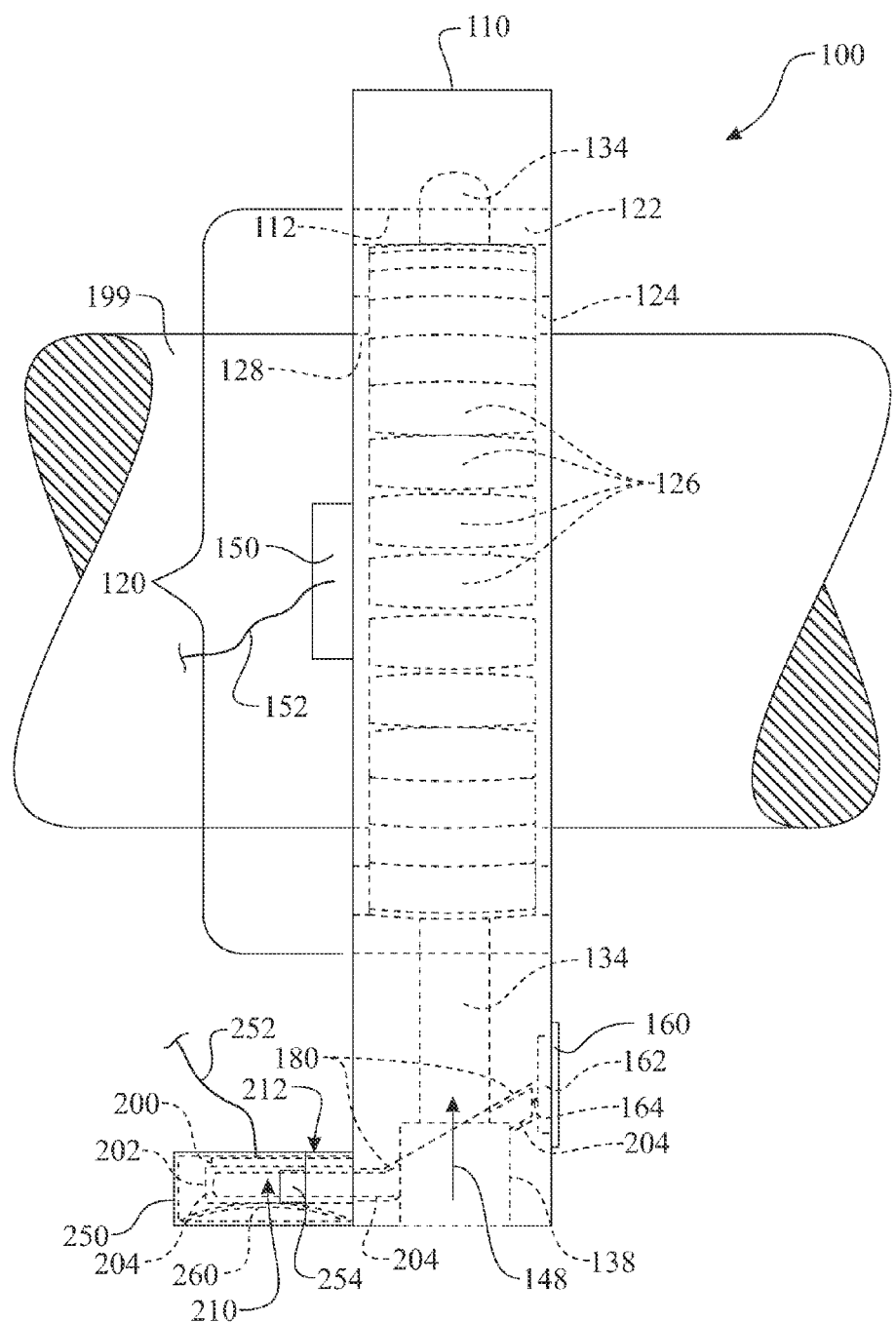
FIG. 3 presents a side elevation view of the exemplary bearing assembly comprising the Thermo-Electric Generator (TEG), originally introduced in FIG. 1.
Figure 4:
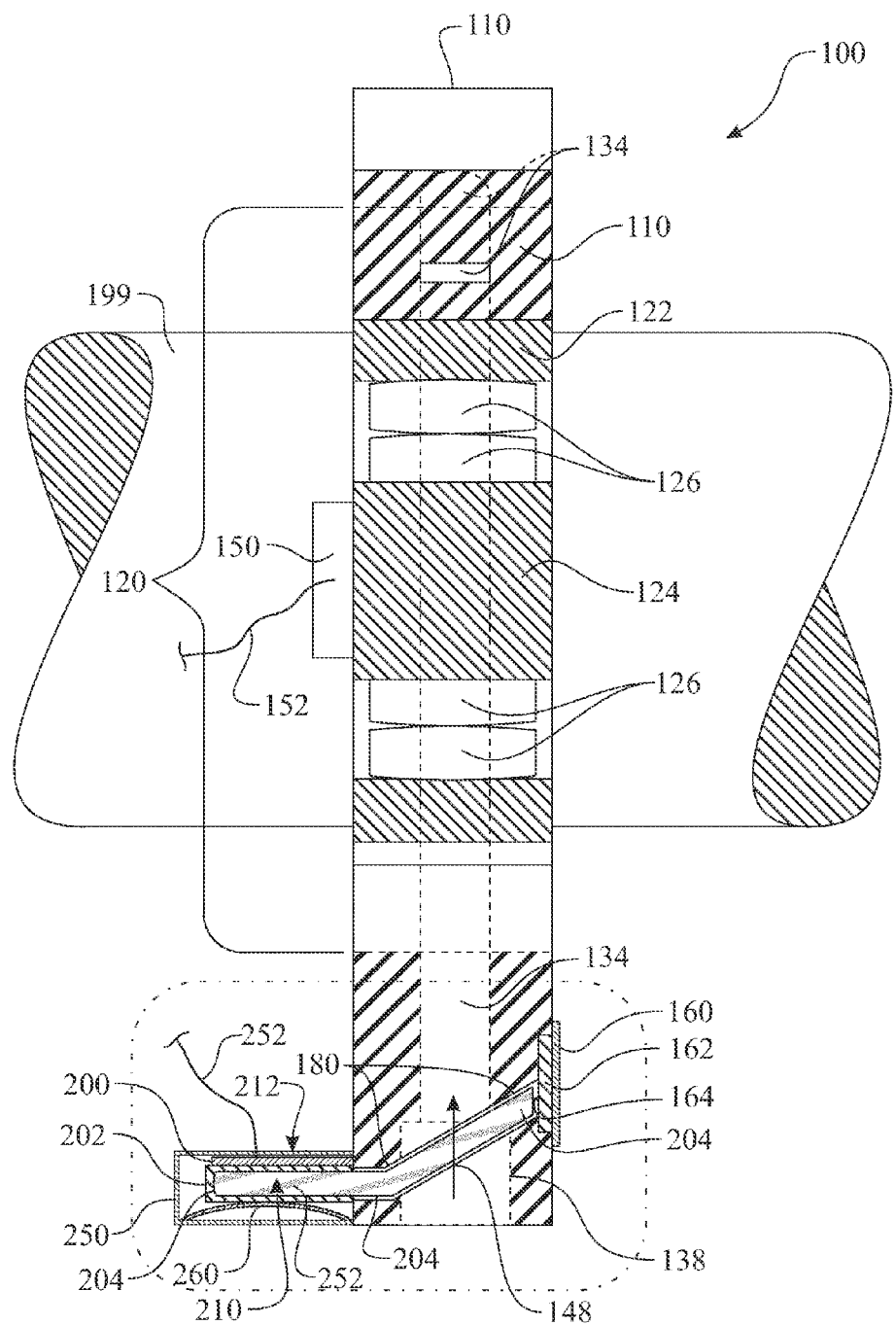
FIG. 4 presents a sectioned side view of the exemplary bearing assembly comprising the Thermo-Electric Generator (TEG), the section taken along a vertical centerline of the thermal energy transfer media.

A power harvesting bearing assembly 100 is illustrated in FIGS. 1 through 5. A power harvesting bearing assembly 100 includes a bearing assembly 120 retained within a bearing housing 110 by a bearing subassembly receptacle 112. The exemplary bearing assembly 120 includes a bearing outer ring 122, a bearing inner ring 124 located within the bearing outer ring 122, and a series of inter ring bearings 126 rotationally assembled between the bearing outer ring 122 and bearing inner ring 124. The inter ring bearings 126 can be spherical, cylindrical, conical, dual-conical, and the like. The mating surfaces of the rings 122, 124 would be designed to accommodate the selected bearing shape. A bearing inner circumferential surface 128 is formed on an inner surface of the bearing inner ring 124. The bearing inner circumferential surface 128 engages with the rotating member, such as a shaft 199 (FIGS. 3 and 4).

Bearing housings 110 are configured in a variety of form factors, having a multitude of optional configurations. One optional feature is an inclusion of an integrated bearing cooling passage system within the bearing housing 110. The optional integrated bearing cooling passage system provides a thermal transfer system to remove heat generated by the rotation of the bearing and/or other rotating components in contact with the bearing. The integrated bearing cooling passage system comprises a cooling system supply port 130, at least one integrated liquid cooling passage 134, and a cooling system return port 138; all in fluid communication with one another. The integrated bearing cooling system would additionally comprise a liquid coolant, an external heat exchanger to remove heat from the liquid coolant, and a pump for driving the liquid coolant through the integrated liquid cooling segments. These components are well known to those skilled in the art.

The integrated bearing cooling passage system initiates at a cooling system supply port 130, which supplies a coolant at a lower temperature into the integrated bearing cooling passage system. The cooler coolant can be transferred directly to an integrated liquid cooling passage 134 (as illustrated in FIG. 2) or via an optional cooling fluid supply transfer conduit 132 provided in fluid communication between the cooling system supply port 130 and the integrated liquid cooling passage 134 (as illustrated in FIG. 1).

The integrated liquid cooling passage 134 is routed within the bearing housing 110 to optimize thermal transfer and heat removal from the power harvesting bearing assembly 100. The coolant is returned to a heat exchanger (not shown) through a cooling system return port 138. The integrated liquid cooling passage 134 can be in direct fluid communication with the cooling system return port 138 (as illustrated in FIG. 2) or via an optional cooling fluid return transfer conduit 136 provided in fluid communication between the integrated liquid cooling passage 134 and the cooling system return port 138 (as illustrated in FIG. 1).

As fluid flows through the integrated bearing cooling passage system, the coolant draws heat from the power harvesting bearing assembly 100. A low temperature supply coolant fluid 140 enters the cooling system supply port 130 at either ambient or a chilled temperature. As the low temperature supply coolant fluid 140 transfers to an entry segment of the integrated liquid cooling passage 134, the fluid can be referred to as a low temperature coolant fluid 142. As the coolant continues flowing through the integrated bearing cooling passage system, more specifically, the integrated liquid cooling passage 134, the coolant draws heat from the power harvesting bearing assembly 100. As the coolant passes through the segment of the integrated liquid cooling passage 134 proximate the bearing assembly 120, the coolant draws heat from the bearing assembly 120. During this heat exchanging process, the coolant is referred to as a thermally transferring fluid 144. As the path of the integrated liquid cooling passage 134 diverges the integrated liquid cooling passage 134 away from the bearing assembly 120, the thermally transferring fluid 144 is no longer drawing heat from the bearing subassembly 120. The integrated liquid cooling passage 134 is routed to initially converge upon the bearing subassembly 120, follows the contour of the bearing subassembly 120, then diverges from the bearing subassembly 120 to connect with the cooling system return port 138. The thermal transfer from the bearing assembly 120 to the coolant diminishes as the integrated liquid cooling passage 134 diverges away from the bearing assembly 120. At this stage in the process, the coolant is referred to as an elevated temperature coolant fluid 146. The coolant is discharged through the cooling system return port 138 for return to the heat exchanger (not shown). The returning, heated coolant is referred to as an elevated temperature return coolant fluid 148.

A Thermo-Electric Generator (TEG) system is integrated into the power harvesting bearing assembly 100 to convert thermal energy to electric power. The Thermo-Electric Generator (TEG) system includes a Thermo-Electric Generator (TEG) 200 in thermal communication with a thermal energy transfer media 204. The thermal energy transfer media 204 would be fabricated of any suitable thermally conductive material forming a heat pipe. The Thermo-Electric Generator (TEG) 200 and thermal energy transfer media 204 are assembled within a thermoelectric generator housing 250. The thermoelectric generator housing 250 is secured to the bearing housing 110 by any mechanical attachment member known by those skilled in the art. The exemplary mechanical attachment member is referred to as a housing fastener 254. The housing fastener 254 can be a threaded fastener, such as a cap bolt (as illustrated), a standard bolt, rivets, and the like. The housing fastener 254 preferably engages with a feature of the bearing housing 110. In the exemplary embodiment, the bearing housing 110 would include a threaded port for receiving the threaded fastener. A thermal transfer conduit 180 is provided extending between the Thermo-Electric Generator (TEG) 200 and a location within the bearing housing 110 proximate a heat-generating source. The thermal energy transfer media 204 in inserted through the Thermo-Electric Generator (TEG) 200 having one end located in thermal communication with the Thermo-Electric Generator (TEG)

200 and a second end located within the thermal transfer conduit 180 proximate the heat-generating source. In the exemplary embodiment, the thermal transfer conduit 180 is routed passing a location proximate a discharge or return end of the integrated bearing cooling passage system. Thermal grease can be optionally applied, coating an exterior surface of the thermal energy transfer media 204 to aid in the insertion and subsequently thermal transfer between the interior wall of the thermal transfer conduit 180 and the exterior surface of the thermal energy transfer media 204. A thermally conductive material 202 can be integrated circumscribing the thermal energy transfer media 204 to optimize the thermal communication between the thermal energy transfer media 204 and the Thermo-Electric Generator (TEG) 200. A biasing element 260 can be employed to retain mechanical contact and thermal communication between the thermally conductive material 202 and the Thermo-Electric Generator (TEG) 200.

Figure 5:
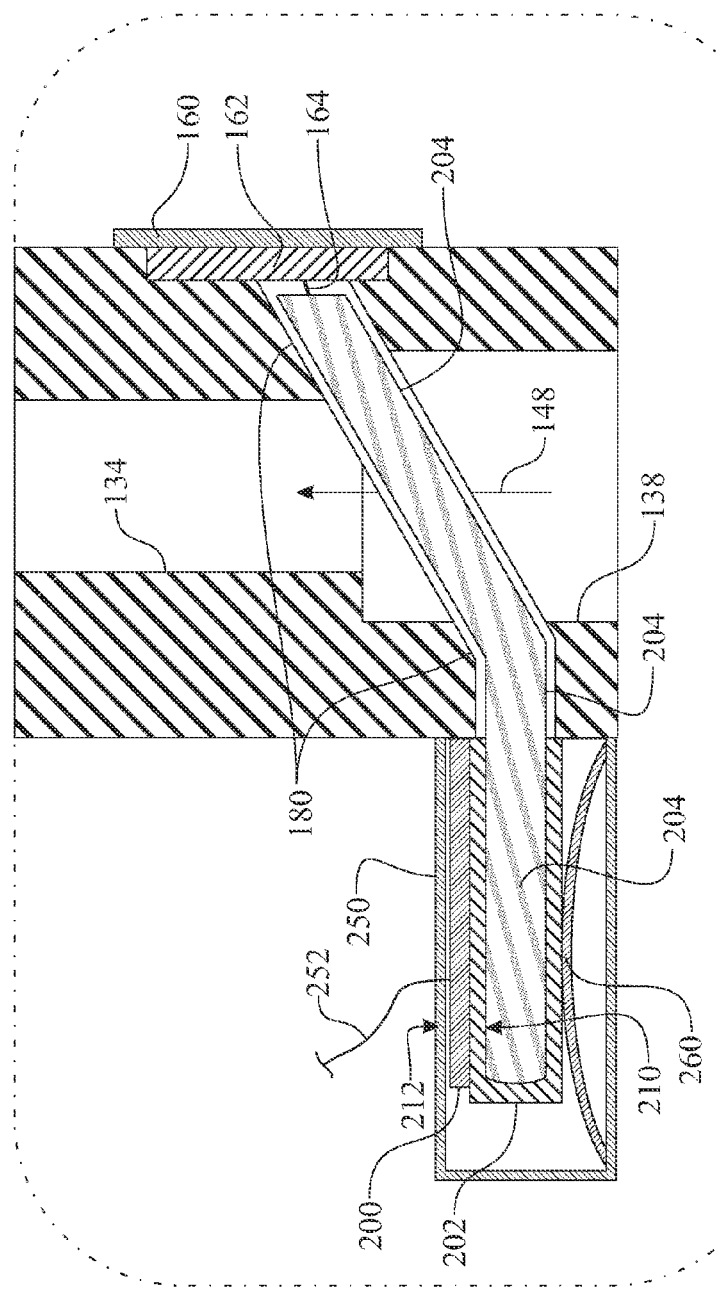
FIG. 5 presents an enlarged sectioned side view of the Thermo-Electric Generator (TEG) portion as illustrated in FIG. 4.

The exemplary embodiment presented in FIGS. 3 through 5 utilizes an existing cable routing conduit as the thermal transfer conduit 180. An electronically operated device 162 is assembled to the bearing housing 110. The electronically operated device 162 can be retained in position using a service access panel 160. It is understood that one or more service access panels 160 can be provided on the bearing housing 110, where the service access panels 160 provide access to interior elements for inspection, servicing, and repairs. A cabling 164 provides electrical and/or signal communication between the electronically operated device 162 and any of a power supply, a data storage device, a data analysis device, a communications device, and the like.

Electrical power generated by the Thermo-Electric Generator (TEG) 200 is transferred to other devices, such as a storage device, other electrically operated equipment, and the like by a condition sensor wiring 152. The condition sensor wiring 152 can be connected to the power input portions of the condition sensor wiring 152 and cabling 164.

The thermal difference between the high temperature source 210 and the low temperature source 212 cause the Thermo-Electric Generator (TEG) 200 to generate an electric energy output. Details of the operation of the Thermo-Electric Generator (TEG) 200 are presented in FIG. 3 and will be described below.

The power harvesting bearing assembly 100 can include a condition sensor 150 or other electrically operated component. Electrical power is transferred from the Thermo-Electric Generator (TEG) 200 to the condition sensor 150 by connecting the generator power output wiring 252 to a condition sensor wiring 152. The condition sensor wiring 152 provides an electrical communication channel between the condition sensor 150 and the generator power output wiring 252. It is understood that the Thermo-Electric Generator (TEG) 200 can provide electrical power to sensors 150 and other electrically operated component located in the general vicinity of the power harvesting bearing assembly 100, including bearing sensors located on other bearing assemblies; temperature sensors; load sensors; revolution counters; speed sensors; microphones; SEE sensors; torque sensors; GPS sensors; communication devices (wired or wireless); communication devices (wired or wireless); alarms; data recording devices (including computers, magnetic tape drives, digital recording devices, disc recording devices, and the like); controllers, and the like.

The Thermo-Electric Generator (TEG) 200 comprises elements of any Thermo-Electric Generator (TEG) known by those skilled in the art. The exemplary embodiment of the Thermo-Electric Generator (TEG) 200 presented herein illustrates one embodiment to describe various elements, the components inter-relation, and function thereof.

The Thermo-Electric Generators (TEG's) 200 are commonly available in a variety of form factors. They are available is a variety of different sizes and performance levels. The Thermo-Electric Generators (TEG's) 200 are offered utilizing either of two technologies: (a) normal thermo couples and (b) thin film technology.

Thermo coupled based Thermo-Electric Generators (TEG's) 200 utilize a thermocouple consists of two conductors of different materials (usually metal alloys). Any junction of dissimilar metals will produce an electric potential related to temperature. The thermocouple produces a voltage in the vicinity of the point where the two conductors contact one another. The voltage in turn generates an electric current. The concept utilizes what is referred to as the Peltier effect. The Peltier effect is the presence of heat at an electrified junction of two different metals. When a current is made to flow through a junction composed of materials A and B, heat is generated at the upper junction at T2, and absorbed at the lower junction at T1. The Thermo-Electric Generator (TEG) applies the thermocouple in accordance with the reverse concept of the Peltier effect, whereby the presence of heat at the upper junction T2, and the presence of a reduced temperature at the lower junction at T1 the thermocouple generates a current.

Thin film technology based Thermo-Electric Generators (TEG's) 200 utilize semiconductor based technology. Thermocouple based Thermo-Electric Generators (TEG's) 200 were efficiencies rarely exceeded 3%. With the advent of semiconductors the efficiency of Thermo-Electric Generators (TEG's) 200 was greatly increased. Therefore, the disclosure focuses on the thin film technology based Thermo-Electric Generators (TEG's) 200.

An exemplary schematic illustrating operational components of a thin film technology based Thermo-Electric Generators (TEG's) 200 is presented in FIG. 3. The Thermo-Electric Generator (TEG) 200 is exposed to a difference in temperature. One side of the Thermo-Electric Generator (TEG) 200 is exposed to a high temperature source 210. The opposite side of the Thermo-Electric Generator (TEG) 200 is exposed to a low temperature source 212. The key component to the Thermo-Electric Generator (TEG) 200 is the p-type semiconductor elements 230 and n-type semiconductor elements 232. Thermal transfer between the high temperature source 210 and semiconductor elements 230, 232 is accomplished by a hot carrier 240. The hot carrier 240 is commonly the contacting or attachment member or section of the Thermo-Electric Generator (TEG) 200. A P side cold carrier 220 and an N side cold carrier 222 are commonly the exposed member or section of the Thermo-Electric Generator (TEG) 200. The hot carrier 240 and cold carriers 220, 222 are located at opposite ends of the semiconductor elements 230, 232. The thermal difference between the hot carrier 240 and cold carriers 220, 222 causes the semiconductor elements 230, 232 to generate a current, which is carried by the generator power output wiring 252.

The Thermo-Electric Generator (TEG) 200 consists of leg pairs of p-type semiconductor elements 230 and n-type semiconductor elements 232. Each leg pair generates a certain voltage. The voltage (U) generated by a Thermo-Electric Generator (TEG) 200 is directly proportional to the number of leg pairs (N) and the temperature difference (ΔT) between top and bottom side times the Seebeck coefficient (α), where:

$$U = N (\text{times}) \Delta T (\text{times}) \alpha.$$

The Seebeck effect is caused by two things: charge-carrier diffusion and phonon drag. Charge carriers in the materials will diffuse when one end of a conductor is at a different temperature from the other. Hot carriers diffuse from the hot carrier 240 to the low temperature source 212, since there is a lower density of hot carriers at the cold end of the conductor, and vice versa. The movement of heat (in the form of hot charge carriers) from one end to the other is a heat current and an electric current as charge carriers are moving.

Recently developed thermoelectric devices are made from alternating p-type semiconductor elements 230 and n-type semiconductor elements 232 connected by metallic connectors. Semiconductor junctions are common in power generation devices, while metallic junctions are more common in temperature measurement. The electrical charge flows through the n-type element 232, crosses a metallic interconnect, and passes into the p-type element 230. The resulting current passes through the generator power output wiring 252.

The generator power output wiring 252 is connected to any electrically operated device, such as the condition sensor 150. In a wired configuration, the generator power output wiring 252 is connected to the condition sensor wiring 152 to transfer the electrical energy from the Thermo-Electric Generator (TEG) 200 to the condition sensor 150, as illustrated in FIG. 3. Alternatively, the Thermo-Electric Generator (TEG) 200 can transfer power to any electrically operated device using a passive wireless power transfer system 270, as illustrated in FIG. 4.

In operation, the Thermo-Electric Generator (TEG) 200 is thermally coupled to the thermal energy transfer media 204. The thermal energy transfer media 204 obtains heat from operation of the bearing. The heat is transferred along the thermal energy transfer media 204 from a first, heat source end located adjacent to the heat source to a second, heat delivery end located adjacent to the Thermo-Electric Generator (TEG) 200. An optional thermal grease, or similar composition, can be disposed between contacting surfaces of the thermal energy transfer media 204 and the thermal transfer conduit 180. The thermal grease enhances the thermal transfer from the bearing housing 110 to the thermal energy transfer media 204. The thermal delivery end of the thermal energy transfer media 204 can be encapsulated within a thermally conductive material 202. The thermally conductive material 202 distributes the thermal energy across a surface to enhance thermal communication between the thermal energy transfer media 204 and the Thermo-Electric Generator (TEG) 200. In the exemplary embodiment, a biasing element 260 is employed to retain contact between the thermally conductive material 202 and the Thermo-Electric Generator (TEG) 200. It is understood that any suitable mechanical attachment element known by those skilled in the art can be employed to retain contact between the thermally conductive material 202 and the Thermo-Electric Generator (TEG) 200.

Figure 6:
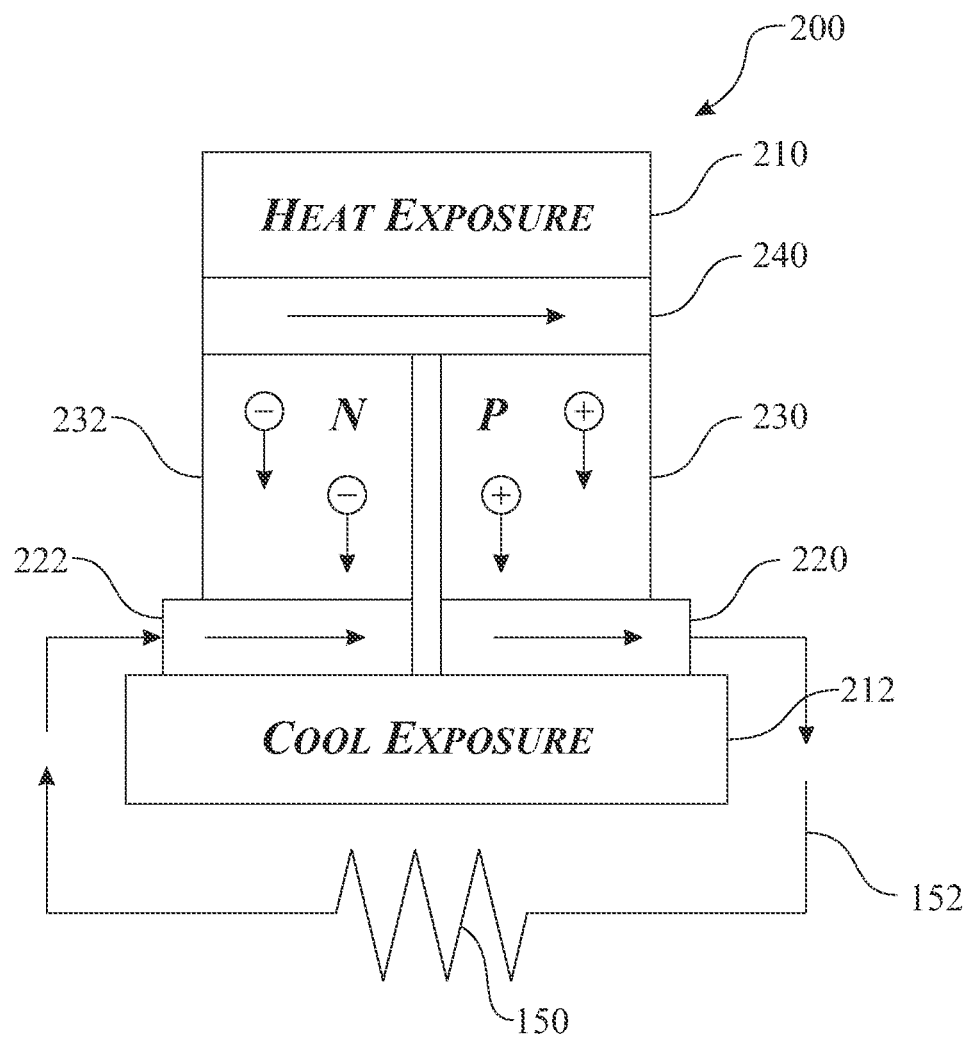
FIG. 6 presents an exemplary schematic illustrating operational elements of an exemplary thin film based Thermo-Electric Generator (TEG)
Figure 7:
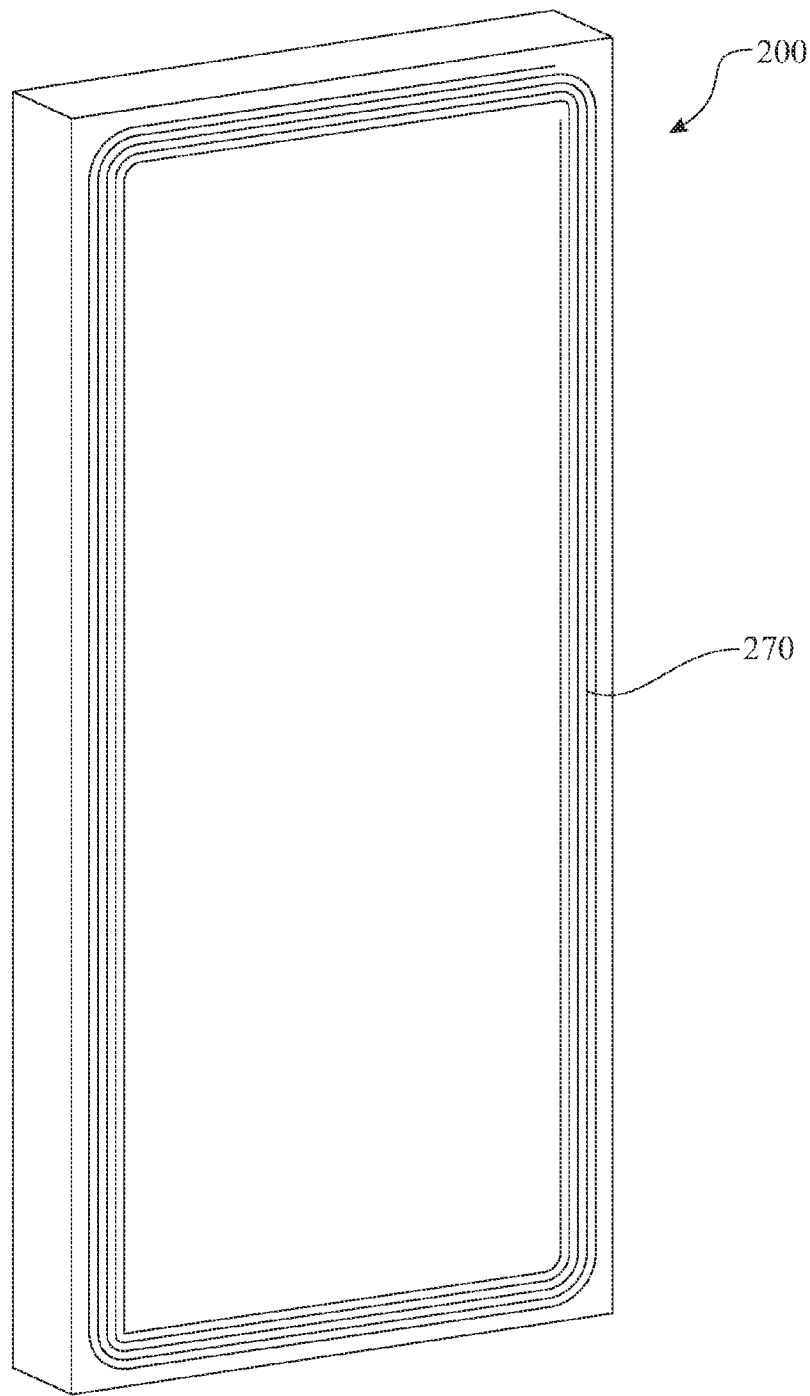
FIG. 7 presents an exemplary Thermo-Electric Generator (TEG) utilizing a passive wireless power transmission system.

The thermal energy from the thermal energy transfer media 204 provides a high temperature source 210 to the Thermo-Electric Generator (TEG) 200. The ambient air surrounding the thermoelectric generator housing 250 provides a low temperature source 212 to the Thermo-Electric Generator (TEG) 200. The thermal difference between the high temperature source 210 and the low temperature source 212 causes the Thermo-Electric Generator (TEG) 200 to generate electric power. The electric power is delivered to one or more target electric power receiving devices by way of a generator power output wiring 252. Details of the operation of an exemplary Thermo-Electric Generator (TEG) 200 are presented in FIG. 6, which is detailed below.

The system can be enhanced with the inclusion of an integrated bearing cooling passage system within the bearing housing 110. Fluid flows through the integrated bearing cooling passage system to remove heat from the power harvesting bearing assembly 100. The integrated bearing cooling passage system includes an integrated liquid cooling passage 134, which is routed to flow adjacent to the bearing assembly 120. As the coolant flows along the integrated liquid cooling passage 134, the coolant transitions from a low temperature coolant fluid 142, to a thermally transferring fluid 144, and ultimately to an elevated temperature coolant fluid 146. The elevated temperature coolant fluid 146 elevates the temperature of the portion of the bearing housing 110 in the general vicinity as a result of conductive thermal properties and a thermal gradient. The thermal transfer conduit 180 would be formed at a location proximate the region having the elevated temperature. Thermal energy is transferred from the source to the thermal energy transfer media 204, which is located within the thermal transfer conduit 180. The thermal energy transfer media 204 transfers the thermal energy obtained from the integrated bearing cooling passage system to the thermally conductive material 202, which ultimately provides the high temperature source 210. As previously described, the exposed ambient air temperature provides the second portion or the low temperature source 212 (via the thermoelectric generator housing 250) required to create the temperature delta for operation of the Thermo-Electric Generator (TEG) 200. The temperature difference between the high temperature source 210 and the low temperature source 212 causes the Thermo-Electric Generator (TEG) 200 to generate electric power. The electric power is transferred from the Thermo-Electric Generator (TEG) 200 to any of a power supply, a data storage device, a data analysis device, a communications device, and the like.

It is understood that the Thermo-Electric Generator (TEG) 200 can be selected from any available or custom designed operating and physical design. The operating characteristics can be designed for any anticipated operational thermal difference and voltage or current output.

Since many modifications, variations, and changes in detail can be made to the described preferred embodiments of the invention, it is intended that all matters in the foregoing description and shown in the accompanying drawings be interpreted as illustrative and not in a limiting sense. Thus, the scope of the invention should be determined by the appended claims and their legal equivalence.

REF. NO. DESCRIPTION 100 power harvesting bearing assembly
110 bearing housing
112 bearing subassembly receptacle
120 bearing subassembly
122 bearing outer ring
124 bearing inner ring
126 inter ring bearings
128 bearing inner circumferential surface
130 cooling system supply port
132 cooling fluid supply transfer conduit 132
134 integrated liquid cooling passage
136 cooling fluid return transfer conduit
138 cooling system return port
140 low temperature supply coolant fluid
142 low temperature coolant fluid
144 thermally transferring fluid
146 elevated temperature coolant fluid
148 elevated temperature supply coolant fluid 150 condition sensor
152 condition sensor wiring
160 service access panel
162 electronically operated device
164 cabling
180 thermal transfer conduit (cable routing conduit)
199 shaft
200 Thermo-Electric Generator (TEG)
202 thermally conductive material
204 thermal energy transfer media
210 high temperature source
212 low temperature source
220 P side cold carrier
222 N side cold carrier
230 p-type semiconductor elements
232 n-type semiconductor elements
240 hot carrier
250 thermoelectric generator housing
252 generator power output wiring
254 housing fastener
260 biasing element
270 passive wireless power transfer system

What is claimed is:

1. A power generating bearing assembly comprising:
a bearing housing comprising:
a bearing subassembly receptacle, and
a thermal transfer conduit;
a bearing subassembly retained within said bearing subassembly receptacle; and
a thermo-electric generator assembly comprising:
a thermo-generator housing,
a thermal energy transfer media extending through said thermal transfer conduit and into said thermo-generator housing,
a thermo-electric generator located within said thermo-generator housing, wherein said thermo-electric generator is subjected to a thermal difference by thermal communication between a first surface of said thermo-electric generator and a surface of said thermal energy transfer media and a second surface of said thermo-electric generator and ambient air,
a thermally conductive material circumscribing a portion of said thermal energy transfer media extending into said thermo-generator housing, and
a biasing member that directly pushes a first surface of said thermally conductive material to retain contact between a second surface of said thermally conductive material and said thermo-electric generator,
wherein during operation, heat generated by rotation of said bearing subassembly elevates a temperature of said bearing housing, said thermo-electric generator converts a thermal difference between a high temperature source provided by said thermal energy transfer media and an ambient temperature to electric power.

2. The power generating bearing assembly as recited in claim 1, wherein said thermally conductive material provides thermal communication between said thermal energy transfer media and said thermo-electric generator.

3. The power generating bearing assembly as recited in claim 1, said thermal transfer conduit further comprises at least one electrical conduit passing therethrough.

4. The power generating bearing assembly as recited in claim 1, further comprising a thermally conductive grease provided between contacting surfaces of said thermal energy transfer media and said thermal transfer conduit.

5. The power generating bearing assembly as recited in claim 1, further comprising a condition sensor, wherein the electric power generated from said thermo-electric generator operates said condition sensor.

6. A power generating bearing assembly comprising:
a bearing housing comprising:
a bearing subassembly receptacle,
at least one integrated liquid cooling passage routed proximate said bearing subassembly receptacle, wherein a fluid flow passing through said at least one integrated liquid cooling passage defines an ambient temperature supply segment and an elevated temperature return segment, and
a thermal transfer conduit having at least one segment routed passing across said elevated temperature return segment of said at least one integrated liquid cooling passage;
a bearing subassembly retained within said bearing subassembly receptacle; and
a thermo-electric generator assembly comprising:
a thermo-generator housing,
a thermal energy transfer media extending through said thermal transfer conduit and into said thermo-generator housing,
a thermo-electric generator located within said thermo-generator housing,
a thermally conductive material circumscribing a portion of said thermal energy transfer media extending into said thermo-generator housing, and
a biasing member that directly pushes a first surface of said thermally conductive material to retain contact between a second surface of said thermally conductive material and said thermo-electric generator,
wherein said thermo-electric generator is subjected to a thermal difference by thermal communication between a first surface of said thermo-electric generator and a surface of said thermal energy transfer media and a second surface of said thermo-electric generator and ambient air, wherein during operation, heat generated by rotation of said bearing subassembly elevates a temperature of said bearing housing, said thermo-electric generator converts a thermal difference between a high temperature source provided by said thermal energy transfer media and an ambient temperature to electric power.

7. The power generating bearing assembly as recited in claim 6, wherein said thermally conductive material provides thermal communication between said thermal energy transfer media and said thermo-electric generator.

8. The power generating bearing assembly as recited in claim 6, said thermal transfer conduit further comprises at least one electrical conduit passing therethrough.

9. The power generating bearing assembly as recited in claim 6, further comprising a thermally conductive grease provided between contacting surfaces of said thermal energy transfer media and said thermal transfer conduit.

10. The power generating bearing assembly as recited in claim 6, further comprising a condition sensor, wherein the electric power generated from said thermo-electric generator operates said condition sensor.

11. The power generating bearing assembly as recited in claim 1, wherein the thermal transfer conduit comprises a pre-existing cable route conduit of the bearing housing.

12. The power generating bearing assembly as recited in claim 5, wherein the electric power is transferred from the thermo-electric generator to the condition sensor by connecting a generator power output wiring of the thermo-electric generator to a condition sensor wiring of the condition sensor.

* * * * *